United States Patent [19]

Kato

[11] 3,987,345
[45] Oct. 19, 1976

[54] INPUT SETTING TYPE PROGRAMMING RELAY

[76] Inventor: Makoto Kato, 36-1-1318, Higashikanamachi1-chome, Katsushika, Tokyo, Japan

[22] Filed: Jan. 16, 1976

[21] Appl. No.: 649,782

Related U.S. Application Data

[63] Continuation-in-part of Ser. No. 490,908, July 22, 1974, abandoned.

[52] U.S. Cl. .............................. 317/134; 307/203; 307/291; 328/119; 340/146.2; 317/148.5 B
[51] Int. Cl.² ...................................... H01H 47/32
[58] Field of Search................... 307/203, 218, 291; 328/119; 340/146.2; 317/148.5 R, 148.5 B, 134

[56] References Cited
UNITED STATES PATENTS 3,054,090   9/1962   Lenk et al...................... 328/119 X
3,311,753   3/1967   Nelson............................ 340/146.2
3,529,176   9/1970   Chapman et al................ 328/119 X Primary Examiner—John Zazworsky
Attorney, Agent, or Firm—Spensley, Horn & Lubitz

[57] ABSTRACT

The input setting type programming relay is provided with a plurality of input terminals for receiving a binary signal, a memory device connected to the input terminals and presettable with signals 1 and 0 corresponding to respective digits of the binary signal and an AND gate circuit connected to the output of the memory device for producing an ON or OFF signal when the signals set in the memory device coincide with the data of respective digits of the input signal.

2 Claims, 4 Drawing Figures

INPUT SETTING TYPE PROGRAMMING RELAY

This is a continuation-in-part of application Ser. No. 490,908 filed on July 22, 1974, and now abandoned.

BACKGROUND OF THE INVENTION

This invention relates to an input setting type programming relay required to set a condition for an input signal.

The term "input setting type programming relay" used herein is intended to mean a type of relay which is different from a conventional relay operated by a single ON–OFF input signal but utilizes as its input a binary signal comprising a plurality of bits such as output signals from a binary counter, shift register counter or the like thereby to produce an output or invert the ON–OFF state when the value of said input signal and the data preset in the relay coincide with each other.

Heretobefore, as a control device of a machine which requires to use a relay, a logical circuit was used and the logical output thereof was used to perform the desired control wherein a plurality of relays are combined to receive a single input signal as the input signal for producing an ON–OFF signal on the output side so that it was necessary to use a plurality of relays, timers, or the like in order to establish a definite control condition thereby complicating circuit construction. Moreover, there is a defect that since this type of relay is of a fixed type it is impossible to vary the control condition.

SUMMARY OF THE INVENTION

It is an object of this invention to provide an improved relay that can eliminate these disadvantages.

Another object of this invention is to provide a novel input setting type programming relay suitable for a wide field of application which is constructed to receive a binary output from an electronic computor, measuring or controlling apparatus or the like for producing an output which is used to control a load when the value of the binary output coincides with a predetermined value.

Still another object of this invention is to provide a novel memory device for use in such an input setting type programming relay capable of performing a binary display in which the display is provided by 1 or 0 as well as a decimal display.

A further object of this invention is to provide a novel input setting type programming relay incorporated with a binary counter for operating a pair of relays on a pair of signal lines.

According to this invention there is provided an input setting type programming relay comprising a plurality of input terminals for receiving an input binary signal, a memory device connected to the input terminals and presettable with 1 and 0 corresponding to respective digits of said input binary signal, and means connected to the output of the memory device for producing an ON or OFF signal when the signals set in the memory device coincide with the data of respective digits of the input binary signal.

In another embodiment, the programming relay further includes a second memory device connected to the input terminals. In this embodiment, an ON signal is produced when the input signal coincides with the first preset value set in the first memory device. The state of the relay does not change even if the input signal changes and continues to produce an ON signal. When the input signal becomes the second preset value set in the second memory device, the state of the relay changes to produce an OFF signal.

The input setting type of programming relays described above can be readily modified to respond to a decimal input signal by merely providing a plurality of memory devices and by presetting each one of them with a digit from 0 through 9 inclusive corresponding to respective digits of a decimal input signal.

BRIEF DESCRIPTION OF THE DRAWINGS

The invention can be more fully understood from the following detailed description taken in conjunction with the accompanying drawings in which.

DESCRIPTION OF THE PREFERRED EMBODIMENT

Figure 1:
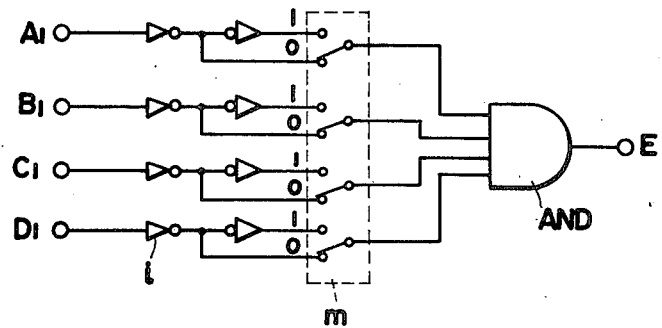
FIG. 1 is a block diagram showing a basic form of an input setting type programming relay embodying the invention.

As illustrated by the basic diagram shown in FIG. 1, the novel input setting type programming relay of this invention comprises a plurality of input terminals $A_1$, $B_1$, $C_1$ and $D_1$, provided for receiving binary signals, inverters $i$ connected in series with the respective input terminals for inverting the phases of the input signals, a memory device M for presetting signals 1 or signals 0, an AND gate circuit AND for providing an AND output of the respective inputs and an output terminal E connected to the AND gate circuit. Suppose now that data 0100 has been preset in the memory device. Where a binary signal 0100 (where 1 means a high level and 0 a low level) is impressed upon the respective input terminals $A_1$, $B_1$, $C_1$ and $D_1$, high level signals are applied to respective inputs of the AND gate circuit thus enabling the AND gate circuit. Accordingly, a signal 1 will be obtained on the output terminal E. With outer input binary signals, a signal 0 will be produced. These output signals are used to control a control device. Depending upon the type of the input signals, the inverter may be omitted.

Figure 2:
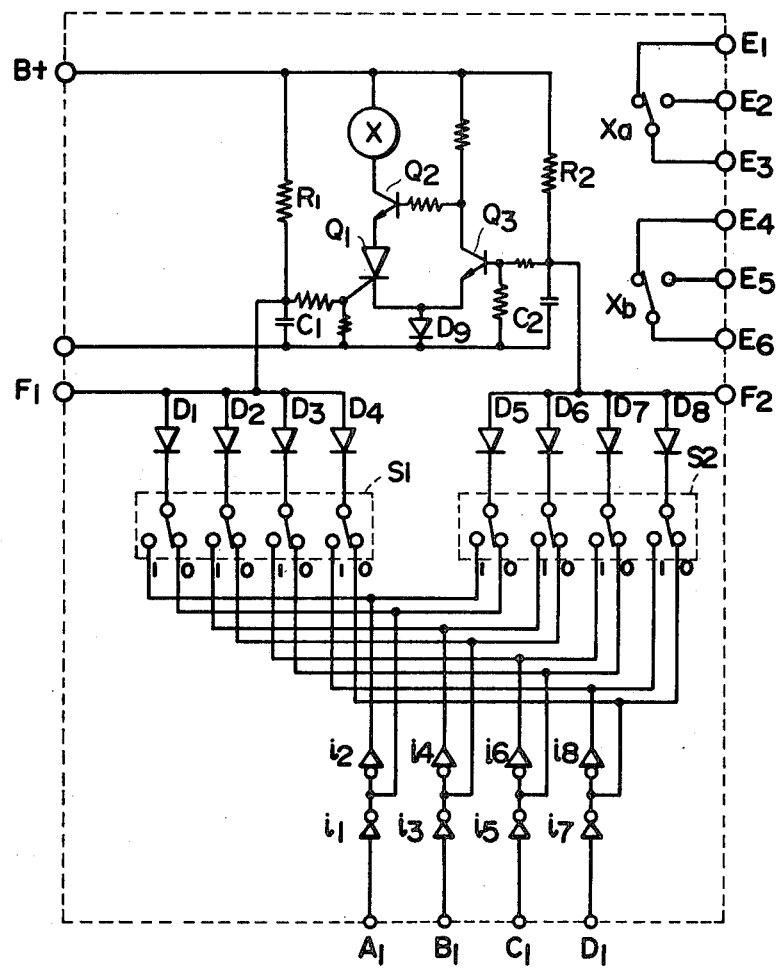
FIG. 2 is a circuit diagram showing the details of an embodiment of the basic form shown in FIG. 1.

Referring now to FIG. 2 showing the details of the electric circuit of the input setting type programming relay, the exciting coils X of a DC relay are ON-OFF controlled by a thyristor-flip-flop circuit for deriving out its contact outputs through terminals $E_1$ through $E_6$. The thyristor-flip-flop circuit comprises a thyristor $Q_1$ and two transistors $Q_2$ and $Q_3$ and is constructed such that the flip-flop circuit is set when thyristor $Q_1$ is turned ON and is reset when transistor $Q_3$ is turned ON and transistor $Q_2$ is turned OFF. In the same manner as has been described in connection with FIG. 1, the set and reset signals of the flip-flop circuit are produced at terminal $F_1$ or $F_2$ when the binary input signal applied to input terminals $A_1$, $B_1$, $C_1$ and $D_1$ coincides with the data preset in the memory device $S_1$ or $S_2$ which are connected on the set side and reset side respectively so that an AND circuit having diodes $D_1$ through $D_4$ on the set side or an AND circuit having diodes $D_5$ through $D_8$ on the reset side is enabled. The inverters $i_1$ through $i_8$ for inverting the input signal may be omitted depending upon the type of the input signal.

In operation, a first and second binary number is preset in memory devices $S_1$ and $S_2$. When a binary signal is impressed upon the respective input terminals $A_1$, $B_1$, $C_1$ and $D_1$ coincides with the first preset number, the thyristor-flip-flop circuit is set thereby turning ON exciting coils X. Exciting coils X will remain in the ON state even if the input signal changes or is removed. When the binary signal impressed upon input terminals $A_1$, $B_1$, $C_1$ and $D_1$ coincides with the second preset number, the thyristor-flip-flop circuit is reset thereby turning OFF exciting coils X.

Figure 3:
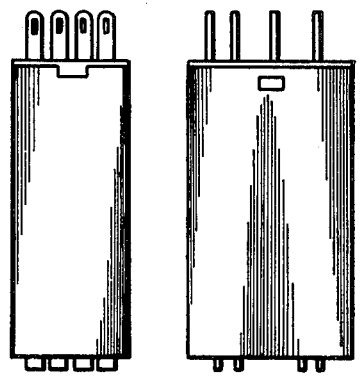
FIG. 3 is a diagrammatic representation of a casing containing the circuit shown in FIG. 2

FIG. 3 is a diagrammatic representation of a casing containing the circuit shown in FIG. 2 and the memory devices for presetting the set and reset data are mounted on the casing. The ON–OFF conditions for controlling a machine are determined by the proper settings of the set and reset data.

Figure 4:
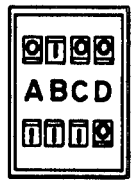
FIG. 4 is a side elevation, partly cut away, of a select switch comprising the memory device utilized in the input setting type programming relay embodying the invention.
Figure 4:
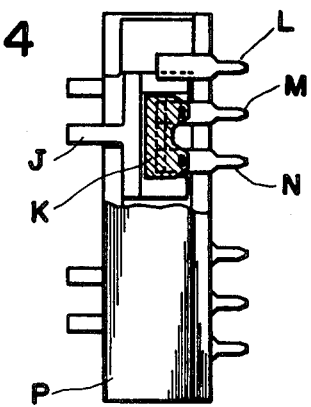

FIG. 4 shows an elevational view, partly in section, of a select switch comprising a memory device utilized in the input setting type programming relay embodying the invention. In the construction shown in FIG. 4, an indicator J for displaying a signal 1 or 0 is slid to move a contact spring K for electrically short circuiting contact terminals M and L or contact terminals M and N thereby setting the select switch corresponding to the signal 1 or 0.

A truth table for the binary signals described above is shown in the following Table 1 and the truth table for the binary register counter is shown in the following Table 2.

TABLE 1

|   | 0 | 1 | 2 | 3 | 4 | 5 | 6 | 7 | 8 | 9 | 10 | 11 | 12 | 13 | 14 | 15 |
|---|---|---|---|---|---|---|---|---|---|---|----|----|----|----|----|----|
| A | 0 | 1 | 0 | 1 | 0 | 1 | 0 | 1 | 0 | 1 | 0  | 1  | 0  | 1  | 0  | 1  |
| B | 0 | 0 | 1 | 1 | 0 | 0 | 1 | 1 | 0 | 0 | 1  | 1  | 0  | 0  | 1  | 1  |
| C | 0 | 0 | 0 | 0 | 1 | 1 | 1 | 1 | 0 | 0 | 0  | 0  | 1  | 1  | 1  | 1  |
| D | 0 | 0 | 0 | 0 | 0 | 0 | 0 | 0 | 1 | 1 | 1  | 1  | 1  | 1  | 1  | 1  |

TABLE 2

|   | 0 | 1 | 2 | 3 | 4 |
|---|---|---|---|---|---|
| A | 0 | 1 | 1 | 1 | 1 |
| B | 0 | 0 | 1 | 1 | 1 |
| C | 0 | 0 | 0 | 1 | 1 |
| D | 0 | 0 | 0 | 0 | 1 |

As described above, since the programming relay of this invention has a simple and compact circuit construction, it can be manufactured at a low cost. Moreover, the settings of the preset data can be readily made by the manipulation of knobs or indicators.

The input setting type programming relay can be modified to respond to a decimal input signal in which a plurality of memory devices is provided each being adapted to be preset with one of the digits from 0 to 9 inclusive, and an AND gate circuit is connected to the outputs of the respective memory devices so that the AND gate circuit produces an ON output signal when the digits preset in respective memory devices coincide with the respective digits of an input decimal signal. In this case, switch means in the form of a rotary switch or a slide switch may be utilized for the memory devices.

Although the invention has been described in terms of a specific embodiment it should be understood that many changes and modifications may be made without departing from the true scope of the inventions as defined in the accompanying claims.

I claim:

1. An input setting type programming relay comprising:
    a plurality of input terminals for receiving an input binary signal;
    a first memory device connected to said input terminals and presettable with signals 1 and 0 corresponding to respective digits of said input binary signal;
    a second memory device connected to said input terminals and presettable with signals 1 and 0 corresponding to respective digits of said input binary signal;
    first AND circuit producing a set signal when first preset value in the first memory device coincides with the input signal;
    second AND circuit producing a reset signal when second preset value in the second memory device coincides with the input signal;
    a flip-flop circuit receiving said set and reset signals;
    a relay coil connected to the set output of said flip-flop circuit;
    a relay contact switched between a first position corresponding to deenergization of said coil and a second position corresponding to energization of said coil; and
    said relay contact being switched to said first position when the input signal takes said first preset value for holding said first position and to said second position when the input signal takes said second preset position.

2. The input setting type programming relay wherein the input setting type programming relay according to claim 1 wherein:
    each of said first and second memory devices comprises a plurality of bistable select switches each being capable of memorizing a binary signal 1 or 0 whereby the data of the binary code signal is represented by 1 or 0 displayed by respective select switches.

* * * * *